United States Patent
Nakahara et al.

(10) Patent No.: US 8,471,326 B2
(45) Date of Patent: Jun. 25, 2013

(54) SEMICONDUCTOR MEMORY DEVICE AND MANUFACTURING METHOD OF SEMICONDUCTOR MEMORY DEVICE

(75) Inventors: Koji Nakahara, Aichi (JP); Kazuhiro Matsuo, Mie (JP); Masayuki Tanaka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/049,573

(22) Filed: Mar. 16, 2011

(65) Prior Publication Data
US 2012/0049258 A1 Mar. 1, 2012

(30) Foreign Application Priority Data

Aug. 30, 2010 (JP) ................. 2010-192420

(51) Int. Cl.
*H01L 21/762* (2006.01)
*H01L 27/115* (2006.01)

(52) U.S. Cl.
CPC .... *H01L 27/11526* (2013.01); *H01L 21/76224* (2013.01); *H01L 27/11543* (2013.01); *H01L 27/11539* (2013.01); *H01L 27/11541* (2013.01)
USPC ....... 257/316; 257/325; 257/326; 365/185.17

(58) Field of Classification Search
USPC .............. 257/288, 296, 298, 314, 315, 499, 257/506, 508, 500, 501, 502, 503, 504, 300, 257/305, 311, 325; 438/424, 427, 428; 365/208, 365/185.01, 185.17, 185.1, 49.12
See application file for complete search history.

(56) References Cited

U.S. PATENT DOCUMENTS

| | | | |
|---|---|---|---|
| 6,897,524 B2 * | 5/2005 | Kamiya | ........................ 257/324 |
| 7,786,524 B2 | 8/2010 | Hazama | |
| 8,072,021 B2 | 12/2011 | Gomikawa et al. | |

(Continued)

FOREIGN PATENT DOCUMENTS

| | | |
|---|---|---|
| JP | 2002-151610 | 5/2002 |
| JP | 2003-289114 | 10/2003 |

(Continued)

OTHER PUBLICATIONS

Korean Office Action Issued Jul. 3, 2012 in Patent Application No. 10-2011-0023749.

(Continued)

*Primary Examiner* — Olik Chaudhuri
*Assistant Examiner* — Wilner Jean Baptiste
(74) *Attorney, Agent, or Firm* — Oblon, Spivak, McClelland, Maier & Neustadt, L.L.P.

(57) ABSTRACT

According to one embodiment, a semiconductor substrate includes a cell region and a peripheral circuit region, a first dielectric film is formed on the semiconductor substrate in the cell region and the peripheral circuit region, a first conductive film is formed on the first dielectric film in the cell region and the peripheral circuit region, a first inter-conductive-film dielectric film is formed on the first conductive film in the cell region, a second inter-conductive-film dielectric film is formed on the first conductive film in the peripheral circuit region and a film thickness thereof is larger than the first inter-conductive-film dielectric film, and a second conductive film is formed on the first inter-conductive-film dielectric film in the cell region and the second inter-conductive-film dielectric film in the peripheral circuit region.

12 Claims, 5 Drawing Sheets

U.S. PATENT DOCUMENTS

| | | |
|---|---|---|
| 2007/0196985 A1 * | 8/2007 | Ozawa et al. ............... 438/257 |
| 2009/0057749 A1 | 3/2009 | Gomikawa et al. |
| 2010/0072542 A1 * | 3/2010 | Kadoya et al. ............... 257/330 |
| 2012/0037973 A1 | 2/2012 | Gomikawa et al. |

FOREIGN PATENT DOCUMENTS

| | | |
|---|---|---|
| JP | 2007-49111 | 2/2007 |
| JP | 2007-266499 | 10/2007 |
| JP | 2008-47590 | 2/2008 |
| JP | 2008-283134 | 11/2008 |
| JP | 2009-54942 | 3/2009 |
| JP | 2009-278119 | 11/2009 |
| KR | 10-2009-0023233 | 3/2009 |

OTHER PUBLICATIONS

Japanese Office Action issued Dec. 18, 2012, in Patent Application No. 2010-192420 (with English-language translation).

* cited by examiner

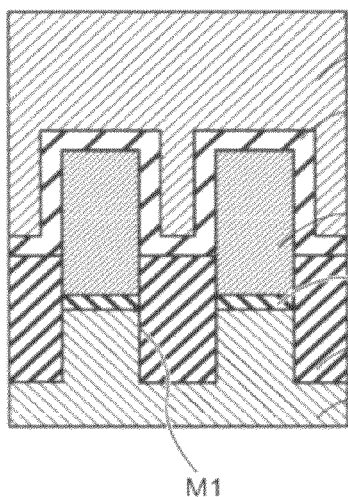
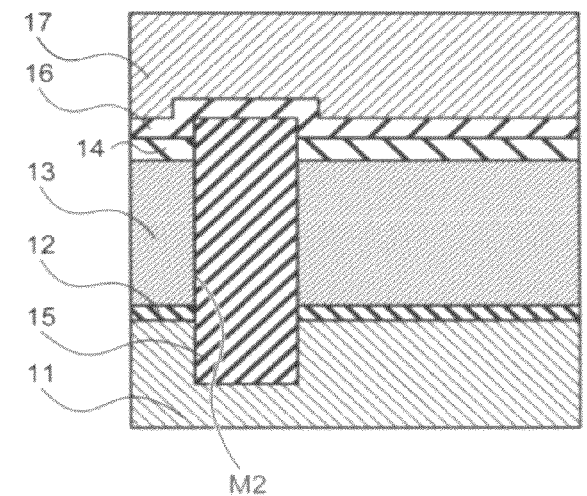
FIG.1A  FIG.1B
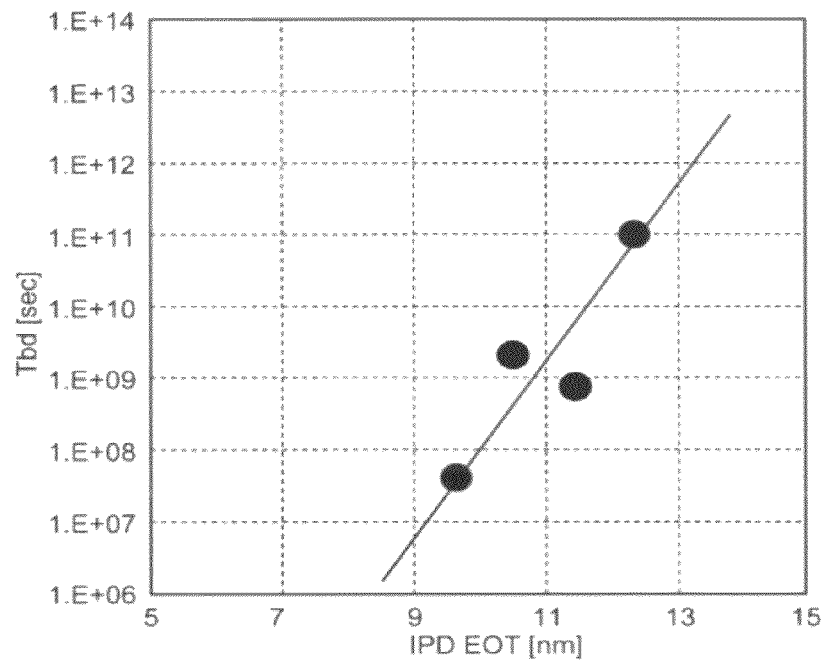
FIG.2

SEMICONDUCTOR MEMORY DEVICE AND MANUFACTURING METHOD OF SEMICONDUCTOR MEMORY DEVICE

CROSS-REFERENCE TO RELATED APPLICATIONS

This application is based upon and claims the benefit of priority from the prior Japanese Patent Application No. 2010-192420, filed on Aug. 30, 2010; the entire contents of which are incorporated herein by reference.

FIELD

Embodiments described herein relate generally to a semiconductor memory device and a manufacturing method of a semiconductor memory device.

BACKGROUND

With the high integration of a nonvolatile semiconductor memory device, a width of a floating gate electrode and a width of an isolation groove are reduced. Reduction in width of the isolation groove degrades burying characteristics of a control gate electrode material after forming an inter-electrode dielectric film.

Moreover, reduction in width of the floating gate electrode increases difficulty in processing and influence on variation in writing characteristics by a processing variation. If the inter-electrode dielectric film is made thinner and thereby improves a coupling property of the floating gate electrode and the control gate electrode to avoid such problem, a life of an element used in a low electric field of a peripheral circuit region deteriorates.

BRIEF DESCRIPTION OF THE DRAWINGS

FIG. 1A is a cross-sectional view illustrating a schematic configuration of a cell region of a semiconductor memory device according to a first embodiment;

FIG. 1B is a cross-sectional view illustrating a schematic configuration of a peripheral circuit region of the semiconductor memory device according to the first embodiment;

FIG. 2 is a diagram illustrating a relationship between an inter-electrode dielectric film of the semiconductor memory device in FIG. 1A and the life thereof;

DETAILED DESCRIPTION

Figure 3:
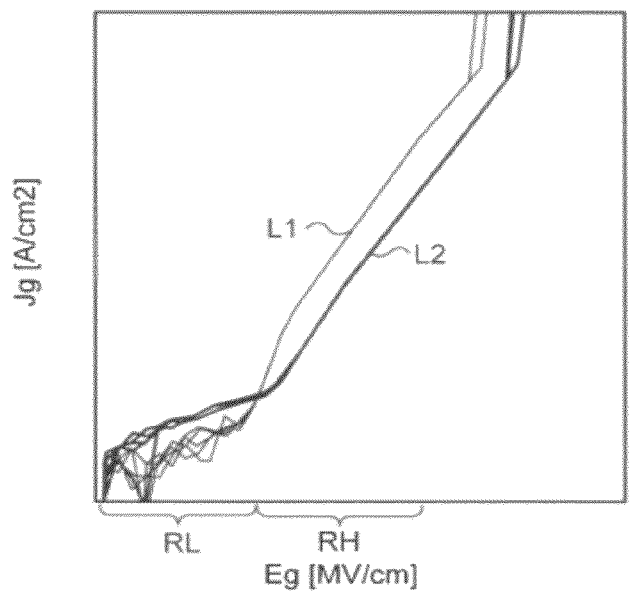
FIG. 3 is a diagram illustrating a relationship between an electric field and a leakage current in a case of using a silicon oxide film and the inter-electrode dielectric film in FIG. 1A by comparing with a case where the silicon oxide film is not provided.

In general, according to one embodiment, a semiconductor substrate, a first dielectric film, a first conductive film, a first inter-conductive-film dielectric film, a second inter-conductive-film dielectric film, and a second conductive film are included. The semiconductor substrate includes a cell region and a peripheral circuit region. The first dielectric film is formed on the semiconductor substrate in the cell region and the peripheral circuit region. The first conductive film is formed on the first dielectric film in the cell region and the peripheral circuit region. The first inter-conductive-film dielectric film is formed on the first conductive film in the cell region. The second inter-conductive-film dielectric film is formed on the first conductive film in the peripheral circuit region and a film thickness thereof is larger than the first inter-conductive-film dielectric film. The second conductive film is formed on the first inter-conductive-film dielectric film in the cell region and the second inter-conductive-film dielectric film in the peripheral circuit region.

A semiconductor memory device according to the embodiments will be explained below with reference to the drawings. The present invention is not limited to these embodiments.

First Embodiment

FIG. 1A is a cross-sectional view illustrating a schematic configuration of a cell region of a semiconductor memory device according to the first embodiment, and FIG. 1B is a cross-sectional view illustrating a schematic configuration of a peripheral circuit region of the semiconductor memory device according to the first embodiment. FIG. 1A is a cross-sectional view cut along a word-line direction (channel width direction).

In FIG. 1A and FIG. 1B, in the semiconductor memory device, a silicon substrate 11 is used as a semiconductor substrate. As a material of the semiconductor substrate, for example, Ge, SiGe, SiC, SiSn, PbS, GaAs, InP, InGaAsP, GaP, GaN, or ZnSe can be used in addition to Si.

In the silicon substrate 11, a cell region and a peripheral circuit region are provided. In the cell region, memory cells used for a NAND-type flash memory or the like can be arranged. In the peripheral circuit region, a peripheral circuit that operates memory cells can be arranged and, for example, a sense amplifier circuit, a column decoder circuit, a row decoder circuit, and the like can be arranged.

On the silicon substrate 11 of the cell region and the peripheral circuit region, a tunnel dielectric film 12 is formed. As the tunnel dielectric film 12, for example, a tunnel oxide film can be used.

On the tunnel dielectric film 12 of the cell region and the peripheral circuit region, a floating gate electrode film 13 is formed. As the floating gate electrode film 13, for example, a polycrystalline silicon film doped with impurities can be used.

On the floating gate electrode film 13 of the peripheral circuit region, a silicon oxide film 14 is formed. This silicon oxide film 14 can be formed by performing a thermal oxidation on the floating gate electrode film 13, by performing a radical oxidation on the floating gate electrode film 13, or by a chemical vapor deposition method.

In the floating gate electrode film 13, the tunnel dielectric film 12, and the silicon substrate 11 of the cell region, isolation grooves M1 are formed. In the silicon oxide film 14, the floating gate electrode film 13, the tunnel dielectric film 12, and the silicon substrate 11 of the peripheral circuit region, an isolation groove M2 is formed.

In the isolation grooves M1 and M2, an isolation dielectric film 15 is buried. As the isolation dielectric film 15, for example, a silicon oxide film can be used.

The film thickness of the isolation dielectric film 15 buried in the isolation groove M1 is set so that the sidewall of the floating gate electrode film 13 is exposed. The film thickness of the isolation dielectric film 15 buried in the isolation groove M2 is set so that the isolation dielectric film 15 protrudes above the silicon oxide film 14.

On the floating gate electrode film 13 of the cell region and the silicon oxide film 14 of the peripheral, circuit region, an inter-electrode dielectric film 16 is formed. As the inter-electrode dielectric film 16, for example, it is possible to use a stacked structure in which at least two of a silicon oxide film, a silicon nitride film, an oxynitride film, and a metal oxide film are used.

In the cell region, the upper surface and the side surface of the floating gate electrode film 13 are covered by the inter-electrode dielectric film 16. In the peripheral circuit region, the upper surface and the side surface of the isolation dielectric film 15 buried in the isolation groove M2 are covered by the inter-electrode dielectric film 16.

On the inter-electrode dielectric film 16 of the cell region and the peripheral circuit region, a control gate electrode film 17 is formed. As the control gate electrode film 17, for example, a polycrystalline silicon film can be used or a silicide film can be used.

In the peripheral circuit region, the inter-electrode dielectric film 16 is formed on the floating gate electrode film 13 via the silicon oxide film 14, and in the cell region, the inter-electrode dielectric film 16 is formed on the floating gate electrode film 13 without via the silicon oxide film 14, so that the film thickness of the dielectric film between the floating gate electrode film 13 and the control gate electrode film 17 can be made thick in the peripheral circuit region compared with the cell region. Therefore, the life of the dielectric film between the floating gate electrode film 13 and the control gate electrode film 17 can be prolonged in the peripheral circuit region compared with the cell region, and the coupling property between the floating gate electrode film 13 and the control gate electrode film 17 can be improved in the cell region compared with the peripheral circuit region.

Moreover, the film thickness of the isolation dielectric film 15 buried in the isolation groove M1 is set so that the sidewall of the floating gate electrode film 13 is exposed, so that the floating gate electrode film 13 can be coupled with the control gate electrode film 17 even at the sidewall thereof, enabling to improve controllability of the potential of the floating gate electrode film 13.

Furthermore, the film thickness of the isolation dielectric film 15 buried in the isolation groove M2 is set so that the isolation dielectric film 15 protrudes above the silicon oxide film 14, so that the corners of the floating gate electrode film 13 can be prevented from being covered by the control gate electrode film 17 and thus electric field concentration can be suppressed and the isolation dielectric film 15 can be prevented from being engraved deeply, enabling to reduce dust.

FIG. 2 is a diagram illustrating a relationship between the inter-electrode dielectric film 16 of the semiconductor memory device in FIG. 1A and the life thereof.

In FIG. 2, if an electrical film thickness IPD EOT of the inter-electrode dielectric film 16 becomes thin, a time Tbd until the inter-electrode dielectric film 16 breaks is shortened. Therefore, the electric film thickness IPD EOT of the inter-electrode dielectric film 16 can be substantially increased by providing the silicon oxide film 14 under the inter-electrode dielectric film 16 and thus the time Tbd until the inter-electrode dielectric film 16 breaks in voltage application can be made long.

FIG. 3 is a diagram illustrating a relationship (L1) between an electric field and a leakage current in a case of using the silicon oxide film 14 and the inter-electrode dielectric film 16 in FIG. 1A by comparing with a case (L2) where the silicon oxide film 14 is not provided.

In FIG. 3, in the stacked structure of the silicon oxide film 14 and the inter-electrode dielectric film 16, the current leakage in a low electric field region RL is low and the current leakage in a high electric field region RH is large compared with the inter-electrode dielectric film 16.

Therefore, the current leakage in the low electric field region RL in the peripheral circuit region can be reduced by using the stacked structure of the silicon oxide film 14 and the inter-electrode dielectric film 16, enabling to reduce power consumption.

Second Embodiment

FIG. 4A to FIG. 8A are cross-sectional views illustrating a manufacturing method of a cell region of a semiconductor memory device according to the second embodiment, and FIG. 4B to FIG. 8B are cross-sectional views illustrating a manufacturing method of a peripheral circuit region of the semiconductor memory device according to the second embodiment.

Figure 4A:
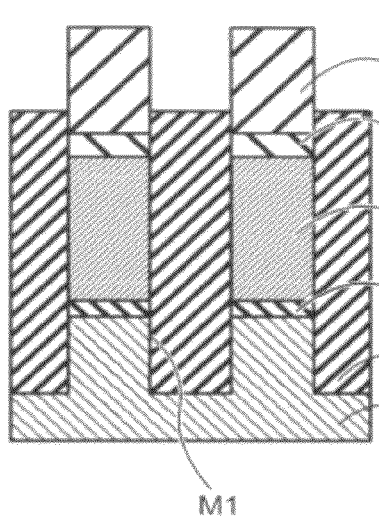
FIG. 4A is a cross-sectional view illustrating a manufacturing method of a cell region of a semiconductor memory device according to a second embodiment.
Figure 4B:
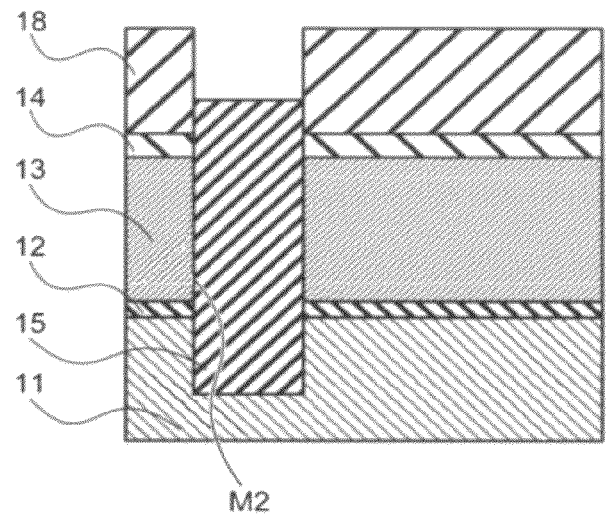
FIG. 4B is a cross-sectional view illustrating a manufacturing method of a peripheral circuit region of the semiconductor memory device according to the second embodiment.

In FIG. 4A and FIG. 4B, the tunnel dielectric film 12 is formed by the thermal oxidation method on the surface of the silicon substrate 11 doped with impurities. The thickness of the tunnel dielectric film 12 can be set to, for example, 6 nm to 10 nm.

Next, the floating gate electrode film 13 is deposited on the tunnel dielectric film 12 by the CVD (Chemical Vapor Deposition) method. The thickness of the floating gate electrode film 13 can be set to, for example, 50 nm to 100 nm. Moreover, as the floating gate electrode film 13, for example, a phosphorus-doped silicon film can be used.

Next, the silicon oxide film 14 is formed on the surface of the floating gate electrode film 13 by the thermal oxidation method. As an oxidant in the thermal oxidation method, for example, oxygen can be used. The thickness of the silicon oxide film 14 can be set to, for example, 1 nm to 10 nm.

The withstanding voltage (life) of the peripheral circuit region can be improved by forming the silicon oxide film 14 by the thermal oxidation method using oxygen.

Moreover, in the process of forming the silicon oxide film 14 on the upper surface of the floating gate electrode film 13, activation of phosphorus, diffusion prevention of phosphorus, polycrystallization of amorphous silicon can also be performed at the same time as the dielectric film formation.

The silicon oxide film 14 can be formed by the thermal oxidation method with hydrogen, $H_2O$, or the like as an oxidant other than the method in which oxygen is used as an oxidant. For reducing load on the base by heat, it is applicable to form the silicon oxide film 14 by using an oxidant in which oxygen is physically excited.

As another method, the silicon oxide film 14 can be formed of a deposited oxide film by the CVO method. As a silicon source at this time, for example, DCS (dichlorosilane), HCD (hexachlorodisilane), or organosilicon compound, or TDMAS (tris(dimethylamino)silane), BTBAS (bis(tertiary-butylamino)silane as amine system, or TEOS (tetraethoxysilane), or the like, can be used.

Moreover, for improving the film quality of the silicon oxide film 14, a silicon oxynitride film can be formed by using NO gas as an oxidant for forming the silicon oxide film 14. Nitrogen is injected into the interface side by using NO gas, so that it is possible to substitute Si—N bonds for dangling bonds and Si—H bonds having a small binding energy at the interface, so that aging of an insulation property, charge trapping, and the like can be reduced, whereby reliability of the silicon oxide film 14 can be improved.

Next, the silicon nitride film 18 is deposited as a hard mask film on the silicon oxide film 14 by the CVD method. The thickness of the silicon nitride film 18 can be set to, for example, 5 nm to 100 nm.

Next, the silicon nitride film 18, the silicon oxide film 14, the floating gate electrode film 13, the tunnel dielectric film 12, and the silicon substrate 11 are sequentially etched by the RIE (Reactive Ion Etching) method by using a first resist mask (not shown) as a mask to form element forming regions separated by the isolation grooves M1 and M2. The width of the element forming region and the width of the isolation grooves M1 and M2 can be set to, for example, about 5 nm to 50 nm.

Next, the isolation dielectric film 15 is formed on the silicon nitride film 18 by a method such as the CVD to fill the isolation grooves M1 and M2. As the isolation dielectric film 15, for example, a silicon oxide film can be used.

Next, the isolation dielectric film 15 on the silicon nitride film 18 is removed by the CMP (Chemical Mechanical Polishing) method with the silicon nitride film 18 as a stopper film.

Next, the isolation dielectric film 15 is recessed by anisotropic etching or isotropic etching to be approximately the same height as the lower surface of the silicon nitride film 18.

The silicon nitride film 18 can be easily stripped and the height of the isolation dielectric film 15 of the peripheral circuit region can be easily adjusted by recessing the isolation dielectric film 15.

When it is possible to ensure an area sufficient for forming a capacitor element in the peripheral circuit region, the isolation dielectric film 15 is preferably left to be higher than the lower surface of the silicon nitride film 18. Consequently, even when a capacitor is formed in the peripheral circuit region, the distance between the edge of the floating gate electrode film 13 and the control gate electrode film 17 can be made large, so that deterioration in life due to the electric filed concentration at the edge portion can be suppressed by causing the sidewall portion not to electrically function as an electrode.

Moreover, as the etching method of the isolation dielectric film 15 at this time, any of the anisotropic etching and the isotropic etching can be performed, and generation of dust due to strip of the silicon nitride film 18 is suppressed by leaving the isolation dielectric film 15 to be higher than the lower surface of the silicon nitride film 18, whereby decrease in yield can be suppressed.

When the sidewall portion of the floating gate electrode film 13 also needs to be used as an electrode for integrating elements in the peripheral circuit region, the isolation dielectric film 15 can be left to be lower than the lower surface of the silicon nitride film 18.

With the peripheral circuit region formed in this manner, the side surface portion of the lower portion electrode can be used as a capacitor, and because the dielectric film thickness between electrodes is large in the upper surface portion, the electric field concentration at an edge portion can be relaxed.

When forming this shape, it is preferable to prevent the silicon oxide film 14 on the floating gate electrode film 13 from being scraped off by the anisotropic etching. Generation of dust due to strip of the silicon nitride film 18 can be suppressed by preventing the silicon oxide film 14 from being scraped off in the cell region, whereby decrease in yield can be suppressed.

Figure 5A:
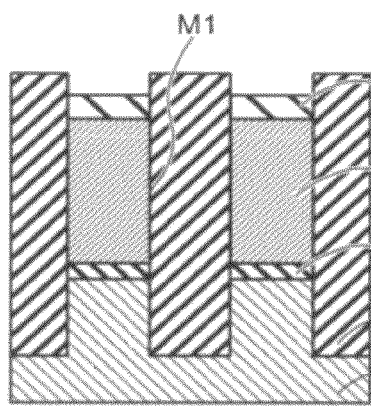
FIG. 5A is a cross-sectional view illustrating the manufacturing method of the cell region of the semiconductor memory device according to the second embodiment.
Figure 5B:
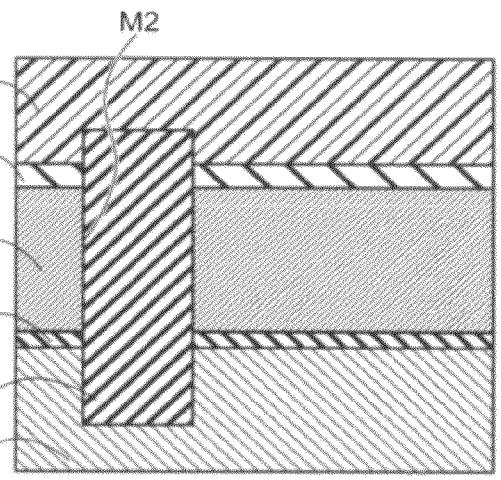
FIG. 5B is a cross-sectional view illustrating the manufacturing method of the peripheral circuit region of the semiconductor memory device according to the second embodiment.

Next, as shown in FIG. 5A and FIG. 5B, the silicon oxide film 14 is exposed by etching away the silicon nitride film 18 with chemicals or the like.

Next, a resist mask 19 that is patterned to cover the peripheral circuit region and not to cover the cell region is formed on the silicon oxide film 14 by using a photolithography technology.

Figure 6A:
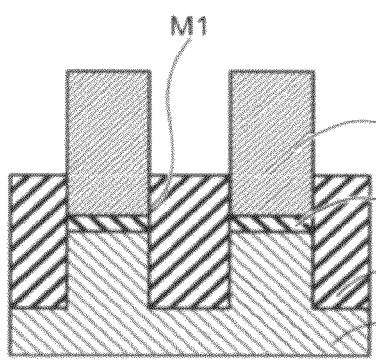
FIG. 6A is a cross-sectional view illustrating the manufacturing method of the cell region of the semiconductor memory device according to the second embodiment.
Figure 6B:
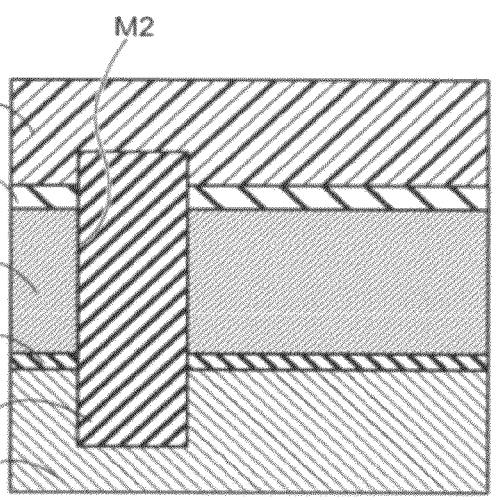
FIG. 6B is a cross-sectional view illustrating the manufacturing method of the peripheral circuit region of the semiconductor memory device according to the second embodiment.

Next, as shown in FIG. 6A and FIG. 6B, the silicon oxide film 14 and the isolation dielectric film 15 are selectively etched with the resist mask 19 as a mask to remove the silicon oxide film 14 in the cell region and recess the isolation dielectric film 15 in the cell region, thereby exposing the upper surface and the upper-side portion of the side surface of the floating gate electrode film 13. The height of the exposed portion of the side surface of the floating gate electrode film 13 can be set to, for example, about 5 nm to 100 nm.

Figure 7A:
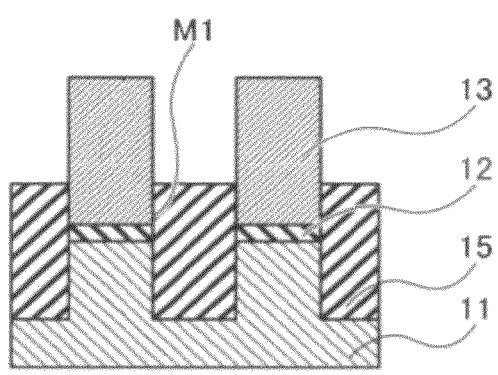
FIG. 7A is a cross-sectional view illustrating the manufacturing method of the cell region of the semiconductor memory device according to the second embodiment.
Figure 7B:
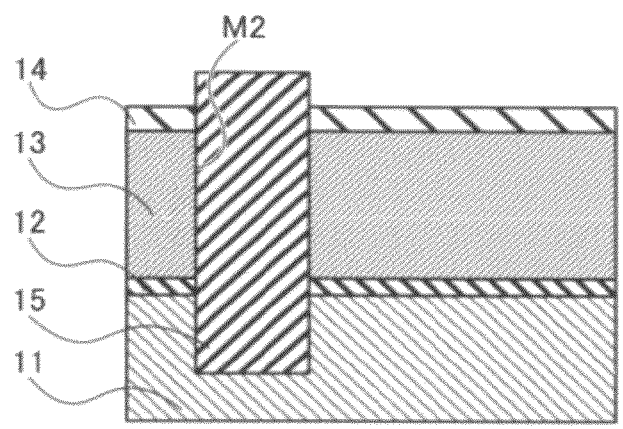
FIG. 7B is a cross-sectional view illustrating the manufacturing method of the peripheral circuit region of the semiconductor memory device according to the second embodiment.

Next, as shown in FIG. 7A and FIG. 7B, the resist mask 19 is removed by a method such as ashing. At this time, in the peripheral circuit region covered by the resist mask 19, the silicon oxide film 14 remains on the floating gate electrode film 13.

Figure 8A:
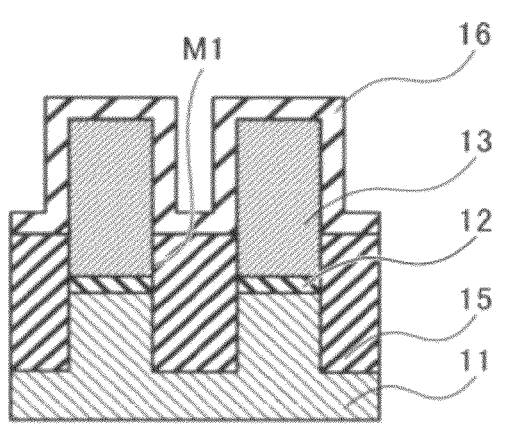
FIG. 8A is a cross-sectional view illustrating the manufacturing method of the cell region of the semiconductor memory device according to the second embodiment.
Figure 8B:
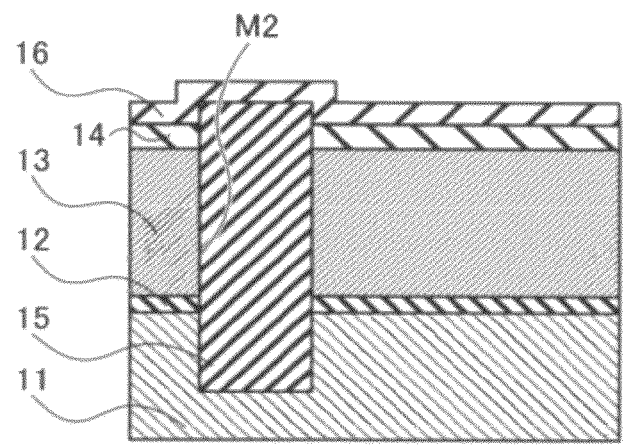
FIG. 8B is a cross-sectional view illustrating the manufacturing method of the peripheral circuit region of the semiconductor memory device according to the second embodiment.

Next, as shown in FIG. 8A and FIG. 8B, the inter-electrode dielectric film 16 is formed on the floating gate electrode film 13 in the cell region and on the silicon oxide film 14 in the peripheral circuit region, for example, by the CVD method. As the inter-electrode dielectric film 16, for example, a stacked structure of silicon oxide film/silicon nitride film/silicon oxide film (ONO) can be used. In the cell region, the inter-electrode dielectric film 16 can be formed to cover the upper surface and the side surface of the floating gate electrode film 13.

Next, as shown in FIG. 1A and FIG. 1B, the control gate electrode film 17 is formed on the inter-electrode dielectric film 16 by a method such as the CVD or sputtering. For example, a stacked structure of a polycrystalline silicon film and a tungsten silicide film can be used for the control gate electrode film 17. Moreover, the thickness of the control gate electrode film 17 can be set to, for example, about 100 nm.

Next, a silicon nitride film (not shown) is deposited on the control gate electrode film 17 by the CVD method.

Next, a second resist mask (not shown) is formed on the silicon nitride film to be orthogonal to the isolation grooves M1.

Next, grooves (not shown) that are orthogonal to the isolation grooves M1 are formed in the silicon nitride film, the control gate electrode film 17, the inter-electrode dielectric film 16, the floating gate electrode film 13, and the tunnel dielectric film 12 by performing the RIE with the second resist mask as a mask. The width and the interval of the floating gate electrode films 13 at this time can be set to, for example, about 50 nm.

Next, a gate sidewall film (not shown) with a thickness of about 10 nm is formed by the thermal oxidation method and the CVD method.

Next, an impurity diffusion layer (not shown) to be a source/drain region is formed by an ion implantation method and thermal annealing.

Next, after forming an inter-layer dielectric film by using the CVD method or the like, wires and the like (not shown) are formed.

In each memory cell of a nonvolatile semiconductor memory device obtained in such manner, the electric field according to a coupling ratio is applied to the tunnel dielectric film 12 by applying a high voltage between the silicon substrate 11 and the control gate electrode film 17, and a tunnel current flows in the tunnel dielectric film 12. Consequently, the accumulated charge in the floating gate electrode film 13 changes and the threshold of the memory cell changes, and a writing or erasing operation of data is performed.

In this nonvolatile semiconductor memory device, a plurality of memory cells are arranged in a word-line direction and a bit-line direction. As a representative of the above described nonvolatile semiconductor memory device, a NAND-type nonvolatile memory that has a configuration in which a plurality of memory cells connected in series are provided between select transistors is raised.

The above explanation relates to a basic configuration and a manufacturing method of a nonvolatile semiconductor memory device, and the above described basic configuration and manufacturing method of the nonvolatile semiconductor memory device are applied also to other embodiments in the similar manner.

In the above described embodiment, the inter-conductive-film dielectric film between the control gate electrode film 17 and the floating gate electrode film 13 can be made thick in the peripheral circuit region compared with the cell region by selectively leaving the silicon oxide film 14 formed on the floating gate electrode film 13 in the peripheral circuit region. Therefore, a semiconductor memory device can be realized, which has a prolonged life in the peripheral circuit region while ensuring a desired coupling in the cell region.

Moreover, in the structure in which the silicon oxide film 14 in the peripheral circuit region is formed on the floating gate electrode film 13 and is used as a dielectric film between the control gate electrode film 17 and the floating gate electrode film 13 together with the inter-electrode dielectric film 16, the silicon oxide film 14 having a relatively large barrier height is formed with a relatively large thickness at the interface in which electrons are injected, so that a leakage current in the low electric-field region is reduced and thus a structure with a high reliability (low power consumption) can be realized.

In the above described embodiment, the portion on the floating gate electrode film 13 is protected by using the resist mask 19 in FIG. 6B in the peripheral circuit region and the upper portion of the isolation dielectric film 15 and the silicon oxide film 14 on the floating gate electrode film 13 are collectively removed in the cell region to expose the sidewall of the floating gate electrode film 13. Therefore, variation in etching process of exposing the sidewall of the floating gate electrode film 13 can be reduced compared with the case of performing removing of the silicon oxide film 14 and recessing of the isolation dielectric film 15 in the cell region by using different resist masks, so that variation in area of the sidewall of the floating gate electrode film 13 can be reduced. Consequently, variation in electrical capacity of the inter-electrode dielectric film 16 can be reduced, so that variation in coupling of the floating gate electrode film 13 and the control gate electrode film 17 can be reduced, resulting in stabilizing the cell operation.

Moreover, the inter-electrode dielectric film 16 is not formed on the sidewall of the floating gate electrode film 13 in the peripheral circuit region, so that the life of an element in the peripheral circuit region can be ensured. After the CMP, the isolation dielectric film 15 is recessed to leave the isolation dielectric film 15 on the upper side of the lower surface of the silicon nitride film 18, so that it becomes possible to avoid the inter-electrode dielectric film 16 from being formed on the side surface portion of the floating gate electrode film 13 in the peripheral circuit region.

Furthermore, when a capacitor is formed in the peripheral circuit region, the distance between the edge of the floating gate electrode film 13 and the control gate electrode film 17 can be made large. Therefore, it becomes possible to cause the sidewall portion not to electrically function as an electrode, so that deterioration in life due to the electric filed concentration at the edge portion can be suppressed.

Moreover, in the inter-electrode dielectric film 16, a radical nitridation is performed on the lowermost layer surface in some cases for the purpose of a bird's beak suppression. In this case, after the process in FIG. 7A and FIG. 7B, an oxynitride film by the radical nitridation is formed in the peripheral circuit region and the cell region. When the silicon oxide film 14 on the floating gate electrode film 13 is sufficiently thick, even if the radical nitridation of the inter-electrode dielectric film 16 is performed, the silicon oxide film 14 remains on the floating gate electrode film 13 and thus it is possible to obtain a dielectric film having a physical film thickness larger in the peripheral circuit region than the cell region.

On the other hand, even when the silicon oxide film 14 is thin, it is possible to obtain a dielectric film electrically thicker in the peripheral circuit region than the cell region. This is because an oxynitride film formed by the radical nitridation is affected by a base. The oxynitride film that is formed by nitriding the silicon oxide film 14 in the peripheral circuit region has a high oxygen ratio (O/N) compared with an (oxy)nitride film formed by nitriding the floating gate electrode film 13 in the cell region and thus the dielectric constant becomes low in the peripheral circuit region compared with that in the cell region.

Moreover, the same thing occurs in any case of forming a nitride film by using the base in addition to the radical nitridation. For example, the same thing occurs also in the case of using a thermal nitridation or nitridation using NO.

In the above described manufacturing method of the semiconductor memory device, if the silicon oxide film 14 is made excessively large, a pattern collapse may occur at the time of forming the element forming regions isolated by the isolation grooves M1. In such case, it is applicable to form the silicon nitride film 18 on the floating gate electrode film 13 without via the silicon oxide film, form the silicon oxide film after removing the silicon nitride film 18 in the element forming region, and then, in the state where the peripheral circuit region is selectively covered by resist, perform removing of the silicon oxide film and recessing of the isolation dielectric film 15 in the cell region. Consequently, it is possible to thicken the inter-conductive-film dielectric film between the control gate electrode film 17 and the floating gate electrode film 13 in the peripheral circuit region compared with the cell region while avoiding the risk of the pattern collapse. Moreover, the silicon oxide film to be left in the peripheral circuit region can be formed both after forming the floating gate electrode film 13 and removing the silicon nitride film 18.

Third Embodiment

Figure 9:
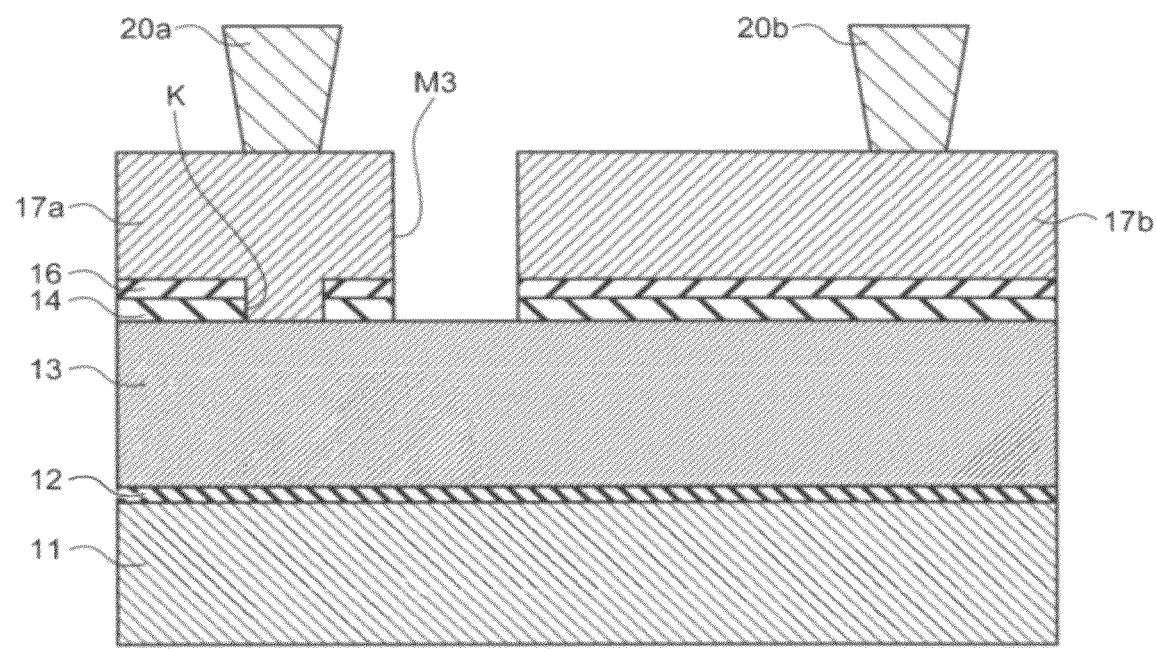
FIG. 9 is a cross-sectional view illustrating a schematic configuration of a peripheral circuit region of a semiconductor memory device according to a third embodiment.

FIG. 9 is a cross-sectional view illustrating a schematic configuration of a peripheral circuit region of a semiconductor memory device according to the third embodiment. In the third embodiment, a method of forming a capacitor in the peripheral circuit region is illustrated.

In FIG. 9, after forming the inter-electrode dielectric film 16 on the floating gate electrode film 13 in the cell region and on the silicon oxide film 14 in the peripheral circuit region, an opening portion K to expose the floating gate electrode film 13 is formed in the silicon oxide film 14 and the inter-electrode dielectric film 16 in the peripheral circuit region by using the photolithography technology and the etching technology. This opening portion K can, for example, be formed at the same time as an opening portion (not shown) provided in the inter-electrode dielectric film for electrically connecting the floating gate electrode film and the control gate electrode film in a select transistor in the cell region.

Next, after forming the control gate electrode film 17 on the inter-electrode dielectric film 16, a groove M3 that separates the control gate electrode film 17 is formed in the silicon oxide film 14, the inter-electrode dielectric film 16, and the control gate electrode film 17 by using the photolithography technology and the etching technology to form a capacitor electrode 17a connected to the floating gate electrode film 13 via the opening portion K and a capacitor electrode 17b insulated from the floating gate electrode film 13 via the silicon oxide film 14 and the inter-electrode dielectric film 16, on the inter-electrode dielectric film 16.

Next, a contact electrode 20a connected to the capacitor electrode 17a and a contact electrode 20b connected to the capacitor electrode 17b are formed.

Consequently, a capacitor in which the silicon oxide film 14 and the inter-electrode dielectric film 16 are used as a capacitor dielectric film can be formed in the peripheral circuit region and the thickness of the capacitor dielectric film can be increased by the silicon oxide film 14, so that the life of the capacitor can be improved compared with the case of using the inter-electrode dielectric film 16 as the capacitor dielectric film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory device comprising:
a semiconductor substrate in which a cell region and a peripheral circuit region are provided;
a first dielectric film that is formed on the semiconductor substrate in the cell region and the peripheral circuit region;
a first conductive film that is formed on the first dielectric film in the cell region and the peripheral circuit region;
a first inter-conductive-film dielectric film that is formed on the first conductive film in the cell region;
a second inter-conductive-film dielectric film that is formed on the first conductive film in the peripheral circuit region and whose film thickness is larger than the first inter-conductive-film dielectric film; and
a second conductive film that is formed on the first inter-conductive-film dielectric film in the cell region and the second inter-conductive-film dielectric film in the peripheral circuit region,
wherein the second inter-conductive-film dielectric film includes the first inter-conductive-film dielectric film and a third inter-conductive-film dielectric film below the first inter-conductive-film dielectric film, and
wherein the third inter-conductive-film dielectric film is a silicon oxide and wherein the first inter-conductive-film dielectric film includes a nitride film that is in contact with the first conductive film, and the second inter-conductive-film dielectric film includes an oxide film or an oxynitride film in which a composition ratio of oxygen to nitrogen is larger than the nitride film and which is in contact with the first conductive film.

2. The semiconductor memory device according to claim 1, wherein the first inter-conductive-film dielectric film and the second inter-conductive-film dielectric film have a stacked structure in which at least two of a silicon oxide film, a silicon nitride film, an oxynitride film, and a metal oxide film are used.

3. The semiconductor memory device according to claim 1, wherein
first and second capacitor electrodes are formed on the second inter-conductive-film dielectric film by separating the second conductive film in the peripheral circuit region; and
an opening portion that connects the first capacitor electrode with the first conductive film in the peripheral circuit region is formed in the second inter-conductive-film dielectric film.

4. The semiconductor memory device according to claim 1, further comprising:
an isolation groove that is formed in the semiconductor substrate in the peripheral circuit region; and
an isolation dielectric film that is buried in the isolation groove.

5. The semiconductor memory device according to claim 4, wherein the isolation dielectric film protrudes above the first conductive film.

6. The semiconductor memory device according to claim 5, wherein the isolation dielectric film penetrates through the third inter-conductive-film dielectric film and is covered by the first inter-conductive-film dielectric film.

7. The semiconductor memory device according to claim 1, wherein a memory cell in which a tunnel dielectric film is formed by the first dielectric film, a floating gate electrode is formed by the first conductive film, an inter-electrode dielectric film is formed by the first inter-conductive-film dielectric film, and a control gate electrode is formed by the second conductive film is formed in the cell region.

8. The semiconductor memory device according to claim 7, further comprising:
an isolation groove that is formed in the semiconductor substrate in the cell region; and
an isolation dielectric film that is buried in the isolation groove.

9. The semiconductor memory device according to claim 8, wherein a film thickness of the isolation dielectric film is set so that an upper surface of the isolation dielectric film reaches a sidewall of the floating gate electrode.

10. The semiconductor memory device according to claim 9, wherein a part of the sidewall of the floating gate electrode is covered by the first inter-conductive-film dielectric film.

11. The semiconductor memory device according to claim 1, wherein the second inter-conductive-film dielectric film is such that a leakage current in a low electric field region is low and a leakage current in a high electric field region is high compared with the first inter-conductive-film dielectric film.

12. The semiconductor memory device according to claim 1, wherein the second inter-conductive-film dielectric film is such that time until being broken in voltage application is longer than the first inter-conductive-film dielectric film.

* * * * *